（12）United States Patent
Colinge

(10) Patent No.: US 11,227,800 B2
(45) Date of Patent: Jan. 18, 2022

(54) METHOD FOR PRODUCING TRANSISTORS IMPLEMENTED AT LOW TEMPERATURE

(71) Applicant: COMMISSARIAT A L'ENERGIE ATOMIQUE ET AUX ENERGIES ALTERNATIVES, Paris (FR)

(72) Inventor: Jean-Pierre Colinge, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/902,873

(22) Filed: Jun. 16, 2020

(65) Prior Publication Data
US 2020/0395249 A1 Dec. 17, 2020

(30) Foreign Application Priority Data
Jun. 17, 2019 (FR) ..................... 19 06449

(51) Int. Cl.
*H01L 21/822* (2006.01)
*H01L 21/762* (2006.01)
*H01L 27/12* (2006.01)

(52) U.S. Cl.
CPC .... *H01L 21/8221* (2013.01); *H01L 21/76254* (2013.01); *H01L 21/76256* (2013.01); *H01L 27/1207* (2013.01)

(58) Field of Classification Search
CPC ........... H01L 21/8221; H01L 21/76254; H01L 21/76256; H01L 27/1207; H01L 27/085;
(Continued)

(56) References Cited

U.S. PATENT DOCUMENTS

| 2004/0121549 A1 | 6/2004 | Dokumaci et al. |
| 2017/0179155 A1 | 6/2017 | Or-Bach et al. |
| 2019/0148367 A1* | 5/2019 | Colinge .............. H01L 27/0924 257/499 |

FOREIGN PATENT DOCUMENTS

| FR | 3 073 667 A1 | 5/2019 |
| WO | WO 2011/154360 A2 | 12/2011 |

OTHER PUBLICATIONS

French Preliminary Search Report dated Feb. 5, 2020 in French Application 19 06449 filed Jun. 17, 2019 (with English Translation of Categories of Cited Documents), 2 pages.

(Continued)

*Primary Examiner* — Selim U Ahmed
(74) *Attorney, Agent, or Firm* — Oblon, McClelland, Maier & Neustadt, L.L.P.

(57) ABSTRACT

Method for producing a JFET transistor, comprising:
a) producing, on a first substrate, a stack comprising a first layer comprising a first semiconductor doped according to a first conductivity type and a second layer comprising a second semiconductor doped according to a second conductivity type, the first layer being disposed between the first substrate and the second substrate, then
b) securing the stack against a second substrate such that the stack is disposed between the first substrate and the second substrate, then
c) removing the first substrate, then
d) etching the first layer such that a remaining portion of the first layer forms a front gate of the first JFET transistor, then
e) etching the second layer such that a remaining portion of the second layer is disposed below the front gate of (Continued)

the first JFET transistor and forms the channel, the source and the drain of the JFET transistor.

19 Claims, 14 Drawing Sheets

(58) Field of Classification Search
CPC . H01L 27/0688; H01L 29/165; H01L 29/802; H01L 29/66916
See application file for complete search history.

(56) References Cited

OTHER PUBLICATIONS

Brunet, L. et al., "First demonstration of a CMOS over CMOS 3D VLSI CoolCube™ integration on 300mm wafers," 2016 Symposium on VLSI Technology Digest of Technical Papers, 2016, 2 pages.
U.S. Appl. No. 16/054,197, filed Aug. 3, 2018, US 2019-0043970 A1, Jean-Pierre Colinge.
U.S. Appl. No. 16/184,346, filed Nov. 8, 2018, US 2019-0148367 A1, Jean-Pierre Colinge et al.
U.S. Appl. No. 16/723,285, filed Dec. 20, 2019, Sylvain Barraud et al.
U.S. Appl. No. 16/854,968, filed Apr. 22, 2020, Jean-Pierre Colinge et al.

* cited by examiner

METHOD FOR PRODUCING TRANSISTORS IMPLEMENTED AT LOW TEMPERATURE

TECHNICAL FIELD

The invention relates to the field of microelectronics, and more specifically the low-temperature production of transistors, that is to say without the implementation of annealing or heat treatment. Advantageously, the invention applies for the production or one or more upper levels of electronic components for monolithic 3D integrated circuits (that is to say forming, at the end of the production of components, a single integrated block), or more generally the production of transistors on any support that may not be exposed to high temperatures.

PRIOR ART

The production of Metal Oxide Semiconductor Field Effect Transistors (MOSFET), even of the junctionless type, inevitably involves the exposure of the support on which the transistors are produced to high temperatures due to the fact that the gate oxide of said transistors must be subjected, during the growth of the material or after the deposit thereof, to annealing implemented at a temperature of at least 600° C. in order to have satisfactory and reliable dielectric properties. This poses a problem when the support on which the transistors are produced includes elements or materials that must not be exposed to high temperatures, such as for example electronic components of a low level on which electrical interconnection layers are located that must not be exposed to temperatures higher than approximately 450° C. or when the support corresponds to a substrate comprising at least one polymer material that degrades at temperatures for example higher than approximately 100° C.

DESCRIPTION OF THE INVENTION

Thus there is a need to propose a method for producing transistors that are compatible with a production on a support that must not be exposed to high temperatures, for example higher than approximately 100° C.

For this, one embodiment proposes a method for producing at least one first JFET transistor, comprising at least the steps of:

a) producing, on a first substrate, a stack comprising at least one first layer comprising a first semiconductor doped according to a first conductivity type and a second layer comprising a second semiconductor doped according to a second conductivity type opposite to the first conductivity type, the first layer being disposed between the first substrate and the second substrate, then b) securing the stack against a second substrate such that the stack is disposed between the first substrate and the second substrate, then c) removing the first substrate, then d) etching the first layer such that at least one remaining portion of the first layer forms a front gate of the first JFET transistor, then e) etching the second layer such that at least one first remaining portion of the second layer is disposed below the front gate of the first JFET transistor and forms the channel, the source and the drain of the first JFET transistor.

In said method, the second substrate, which corresponds to the final support on which the first transistor is produced, is not exposed to high thermal budgets. Steps b) to e) are implemented at low temperatures, for example lower than approximately 100° C. Thus, when the second substrate includes for example electronic components with metal interconnection levels and/or materials that may degrade when same are exposed to high temperatures such as polymers, said second substrate is not subject to any degradation related to the production of the first JFET transistor. During the method, only step a) may be implemented at high temperatures. However, the second substrate is not exposed to the implementation of said step.

The method makes it possible to produce one or more N- or P-type, or N- or P-channel, transistors.

When the second substrate corresponds to a plate comprising already made CMOS components, said method makes it possible to produce a 3D monolithic circuit with a so-called "cold" process for the production of the upper active layer.

The second substrate may include CMOS-type electronic components, and/or the second substrate may include at least one material degrading at a temperature higher than approximately 100° C., or include at least one material whose electrical properties change when it is exposed at a temperature higher than 100° C.

The first semiconductor may be silicon or SiGe, and the second semiconductor may be silicon or SiGe.

The method may be such that the stack includes a third layer comprising a third semiconductor doped according to the first conductivity type and such that the second layer is disposed between the first layer and the third layer.

The method may be such that step e) is implemented such that at least one second remaining portion of the second layer forms a front gate of a second JFET transistor.

The method may further include, after step e), step f) of etching the third layer such that at least one first remaining portion of the third layer is disposed below the channel, the source and the drain of the first JFET transistor and that at least one second remaining portion of the third layer is disposed below the front gate of the second JFET transistor and forms the channel, the source and the drain of the second JFET transistor.

In this case, the implementation of said method makes it possible to produce on the second substrate one or more N-type transistors and one or more P-type transistors. In addition, the presence of the first remaining portion of the third layer below the channel, the source and the drain of the first JFET transistor makes it possible to increase the depletion in the channel of the first JFET transistor.

The first and third semiconductors may be identical.

Advantageously:

the first and third semiconductors may be silicon and the second semiconductor may be SiGe, or the first and third semiconductors may be SiGe and the second semiconductor may be silicon.

Thus, the first semiconductor may be etched selectively towards the second semiconductor, and the second semiconductor may be etched selectively towards the third semiconductor.

The stack may include a fourth layer comprising a fourth semiconductor doped according to the second conductivity type and such that the third layer is disposed between the second layer and the fourth layer, and the method may further include, after step f), step g) of etching the fourth layer such that at least one first remaining portion of the fourth layer is disposed below the first remaining portion of the third layer and that at least one second remaining portion of the fourth layer is disposed below the channel, the source and the drain of the second JFET transistor. In this case, the presence of the second remaining portion of the fourth layer below the channel, the source and the drain of the second JFET transistor makes it possible to increase the depletion in the channel of the second JFET transistor.

The second and fourth semiconductors may be identical, that is to say may correspond to the same semiconductor material (same chemical composition).

Advantageously, the securing of the stack against the second substrate may include a direct bonding between a first oxide layer produced on the stack and a second oxide layer produced on the second substrate.

According to a first embodiment, step c) may include an elimination of the first substrate by abrasion and by chemical attack.

The first substrate may be of SOI type.

According to a second embodiment, the method may further include, before step b), a step of producing a separation interface in the first substrate, and wherein step c) includes a separation of the first substrate at the separation interface.

The production of the separation interface in the first substrate may include at least one implantation of ions, for example hydrogen ions, in the first substrate.

The method may further include, after step e), the production of electrical interconnections electrically connected at least to the front gate, the source and to the drain of the first JFET transistor.

Steps a) to e) may be repeated one or more times by using, as second substrate, the structure obtained during the previous implementation of steps a) to e). Thus, it is possible to produce a plurality of superimposed levels of transistors without degrading, during each implementation of steps a) to e), the lower levels forming the support on which each level of JFET transistors is produced.

The method may further include, between steps a) and b), a step of turning over the assembly comprising the first substrate and the stack such that the stack is disposed opposite the second substrate.

Said at least one first layer and the second layer are produced by epitaxy. Thus, in addition to the making of the JFET at low temperature, the use of epitaxy to produce the first and second layers enables to avoid crystalline difference between the first and second layers.

BRIEF DESCRIPTION OF THE DRAWINGS

The present invention will be better understood upon reading the description of examples of embodiments given, purely by way of indicative and non-limiting example, while referring to the appended drawings wherein.

Identical, similar or equivalent portions of the various figures described hereafter bear the same numerical references such as to facilitate the change from one figure to the other.

The various portions shown in the figures are not necessarily according to a uniform scale, in order to make the figures more readable.

The various possibilities (variants and embodiments) must be understood as not being exclusive from one another and may be mutually combined.

DETAILED DESCRIPTION OF SPECIFIC EMBODIMENTS

A method for producing JFET transistors according to a first embodiment is described below in relation to FIGS. 1A to 1G.

Figure 1A:
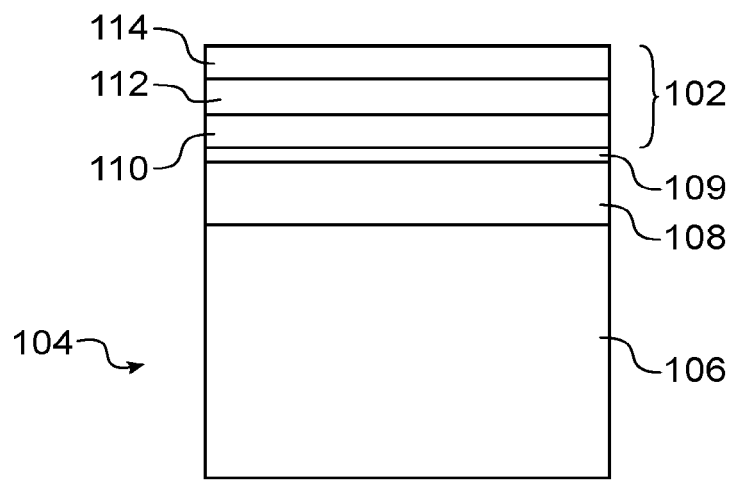
FIGS. 1A-1G show the steps of a method for producing JFET transistors according to a first embodiment.

A stack 102 of a plurality of doped semiconductor layers is produced on a first substrate 104 (FIG. 1A).

In said first embodiment, the first substrate 104 corresponds to a substrate of semiconductor on insulator type, for example SOI (Silicon On Insulator). The first substrate 104 comprises a support layer 106, for example silicon, a buried dielectric layer 108 also called BOX (Buried Oxide) disposed on the support layer 106 and comprising for example $SiO_2$, and a semiconductor surface layer 109, comprising for example silicon, disposed on the buried dielectric layer 108.

A first layer 110 of the stack 102 comprising P-doped SiGe is produced on the surface layer 109. The SiGe of the first layer 110 is for example obtained by epitaxy.

The stack 102 also includes a second layer 112 of N-doped silicon and a third layer 114 of P-doped SiGe. The second layer 112 is disposed between the first layer 110 and the third layer 114. The second and third layers 112, 114 are for example produced by epitaxy, at a temperature between 600° C. and 1000° C.

Each of the first, second and third layers 110, 112, 114 has a thickness for example between approximately 6 nm and 20 nm.

The doping of the semiconductors of the first, second and third layers 110, 112, 114 is for example obtained in-situ during the production of said layers. The doping levels of the semiconductors of the first, second and third layers 110, 112, 114 are for example between approximately $10^{18}$ cm$^{-3}$ and $5.10^{19}$ cm$^{-3}$.

Figure 1B:
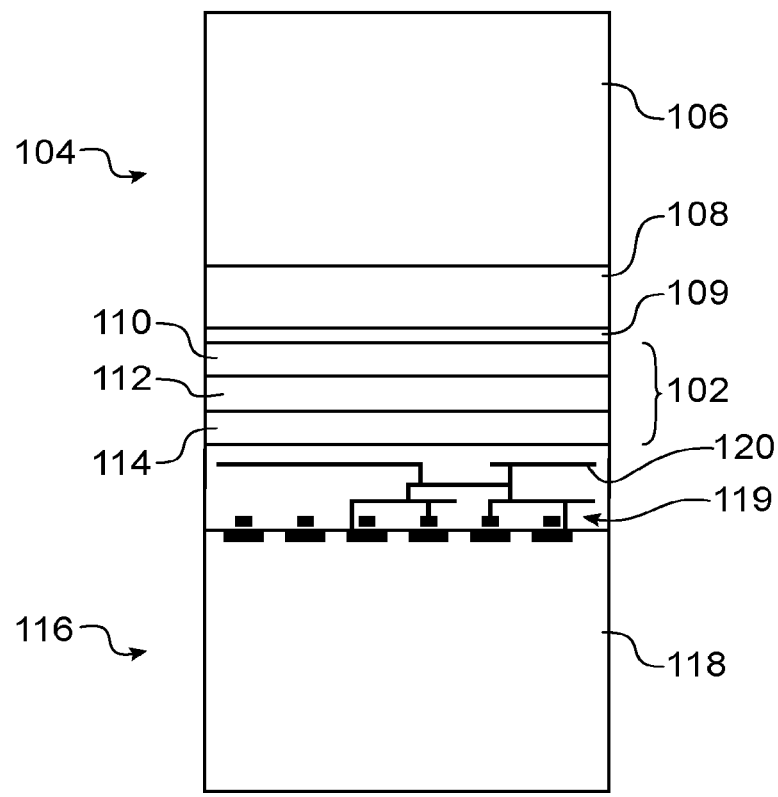

The stack 102 is subsequently secured against a second substrate 116 such that the stack 102 is disposed between the first substrate 104 and the second substrate 116 (FIG. 1B).

The second substrate 116 includes for example a layer 118 of semiconductor, for example silicon, wherein electronic components 119 have been integrated prior to the securing of the stack 102. Said electronic components 119 are for example of CMOS type and may be produced as described in the document "First demonstration of a CMOS over CMOS 3D VLSI CoolCube™ integration on 300 mm wafers" by L. Brunet and al., Symposium on VLSI Technology Digest of Technical Papers 2016, pp. 1-2.

The second substrate 116 also includes electrical interconnection layers 120 disposed on the layer 118, above the electronic components 119 and forming electrical connections connected to the electronic components 119 present in the layer 118.

The securing between the second substrate 116 and the stack 102 includes for example the implementation of a direct bonding between an oxide layer (not visible in FIGS. 1A and 1B) produced on the third layer 114 and an oxide layer of the electrical interconnection layers 120, optionally followed by a thermal annealing at a temperature lower than same that may be supported by the second substrate 116 (approximately 450° C. in the case of bonding on a material such as silicon or lower than 100° C. in the case of a substrate 116 containing an organic or plastic polymer). The oxide layers include for example $SiO_2$. Other types of bonding may be implemented in order to produce said securing, by using for example layers of SiCN or of $Si_3N_4$ or of other dielectric materials.

Figure 1C:
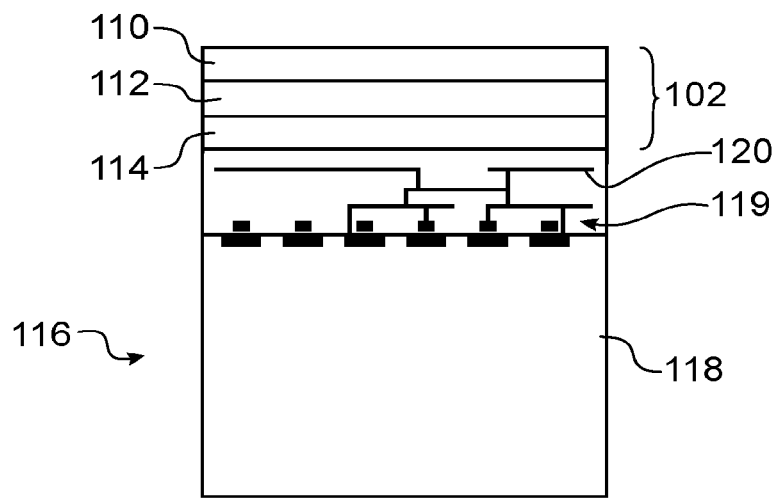

The first substrate 104 is subsequently removed (FIG. 1C). In the first embodiment, the removal of the first substrate 104 is produced by eliminating the layers 106, 108 and 109 for example by abrasion (CMP or chemical-mechanical planarization), then by chemical attack, for example in TMAH (tetramethylammonium hydroxide) to remove the remaining silicon from the layer 106 after planing, followed by HF-based etching to remove the layer 108, followed by TMAH etching to remove the layer 109. After said removal, the face of the first layer 110 that was disposed against the first substrate 104 is accessible.

Figure 1D:
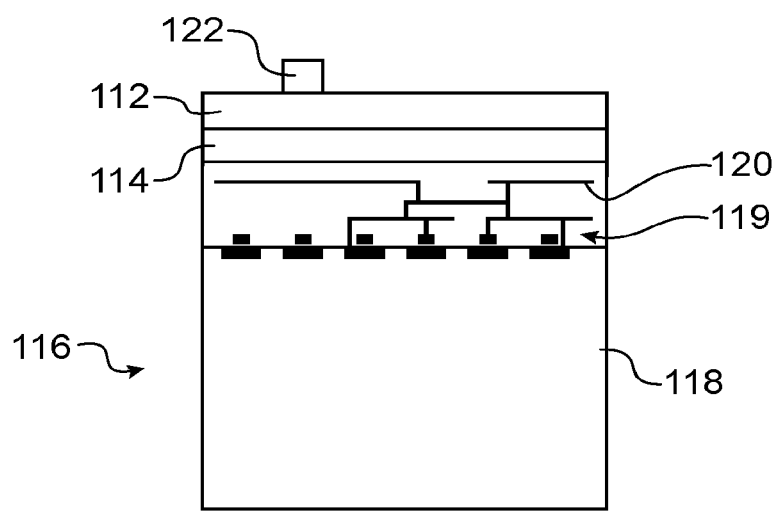

The first layer 110 is subsequently etched, by implementing a lithography step and a plasma etching, such that at least one remaining portion of the first layer 110 forms a front gate 122 of a first JFET transistor (FIG. 1D). Due to the fact that the first layer 110 includes SiGe and that the second layer 112 includes silicon, the etching of the first layer 110 may be carried out selectively towards the second layer 112. If the material of the first layer 110 cannot be etched selectively towards the material of the second layer 112, the etching time is used as etch stop criterion. The number of remaining portions of the first layer 110 kept at the end of said etching corresponds at least to the number of front gates desired, and therefore to the number of first JFET transistors to be produced.

Figure 1E:
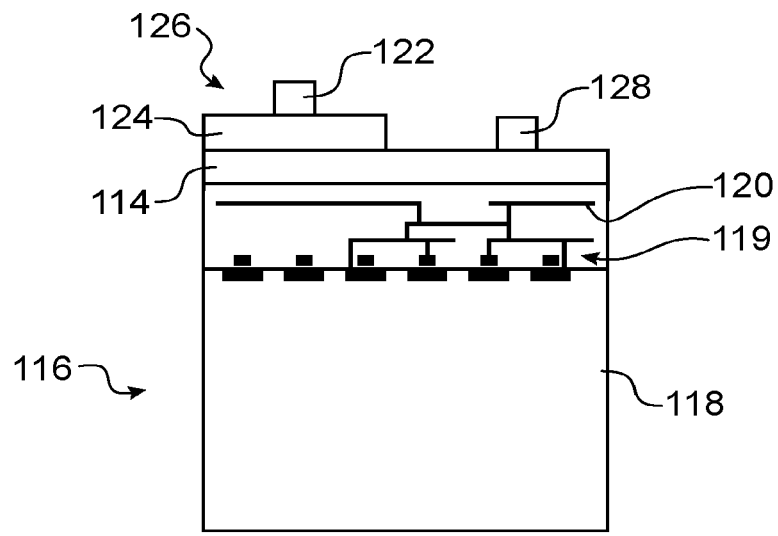

As the first layer 110, the second layer 112 is subsequently etched such that at least one first remaining portion 124 of the second layer 112 is disposed below the front gate 122 of the first JFET transistor and forms the channel, the source and the drain of the first JFET transistor (FIG. 1E). Due to the fact that the second layer 112 includes silicon and that the third layer 114 includes SiGe, the etching of the second layer 112 may be carried out selectively towards the third layer 114. If the material of the second layer 112 cannot be etched selectively towards the material of the third layer 114, the etching time is used as etch stop criterion. The reference 126 visible in FIG. 1E designates the first JFET transistor that is of N type.

In the first embodiment described here, said etching of the second layer 112 is implemented such that at least one second remaining portion of the second layer forms a front gate 128 of a second JFET transistor. The number of second remaining portions of the second layer 112 kept at the end of said etching corresponds at least to the number of front gates desired, and therefore to the number of second JFET transistors to be produced.

Figure 1F:
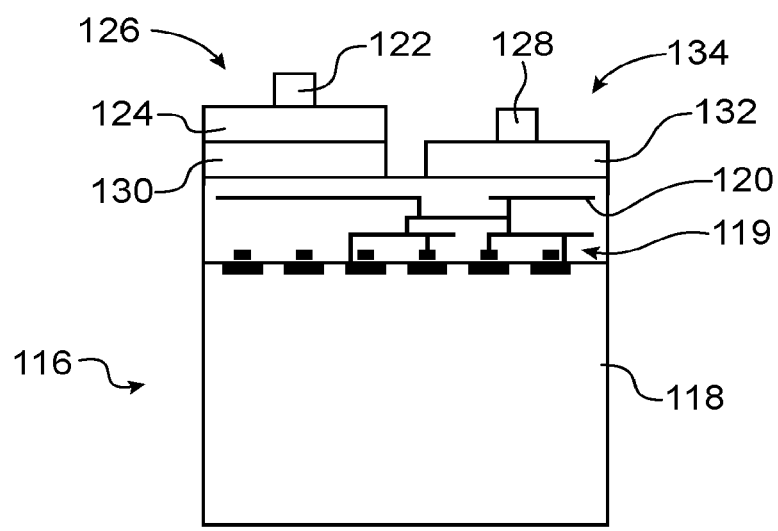

The third layer 114 is subsequently etched such that at least one first remaining portion 130 of the third layer 114 is disposed below the channel, the source and the drain of the first JFET transistor 126 and that at least one second remaining portion 132 of the third layer 114 is disposed below the front gate 128 of the second JFET transistor and forms the channel, the source and the drain of the second JFET transistor (FIG. 1F). The reference 134 visible in FIG. 1F designates the second JFET transistor that is of P-type. The presence of the P-doped portion 130 below the first JFET transistor 126 makes it possible to increase the depletion in the channel of the first JFET transistor 126.

Figure 1G:
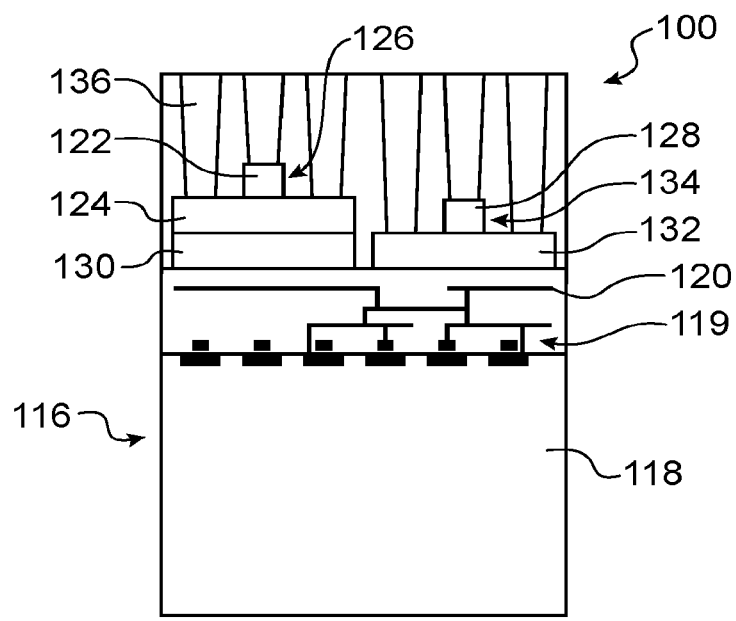

The method is completed by producing on the JFET transistors 126, 134 electrical interconnections 136 connected to the gates, to the sources and to the drains of said JFET transistors 126, 134 (FIG. 1G). Said electrical interconnections 136 form the Back End Of Line (BEOL) of the integrated circuit 100 produced.

A method for producing JFET transistors according to a second embodiment is described below in relation to FIGS. 2A to 2G.

Figure 2A:
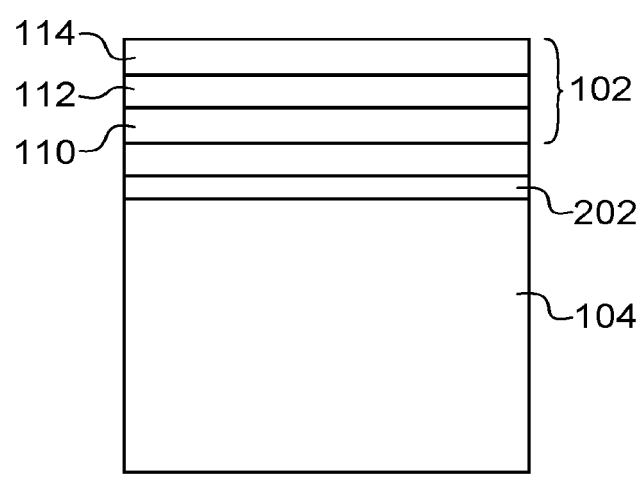
FIGS. 2A-2G show the steps of a method for producing JFET transistors according to a second embodiment.

As in the first embodiment, the stack 102 of a plurality of doped semiconductor layers is produced on a first substrate 104 (FIG. 2A). In said second embodiment, the first substrate 104 corresponds to a bulk substrate of semiconductor, for example silicon.

The layers 110, 112 and 114 are produced by epitaxy on the first substrate 104, for example in a similar manner to the first embodiment previously described. The materials, dopings and dimensions are for example identical to same previously described in relation to the first embodiment.

In order to be able to produce thereafter the removal of the first substrate 104 towards the stack 102, a separation interface 202 is formed in or on the first substrate 104. Preferably, the separation interface 202 is disposed as close as possible to the upper face of the first substrate 104 on which the stack 102 is produced, in order to limit the remaining thickness of the first substrate 104 on the final product. Said separation interface 202 is for example produced by implantation of hydrogen ions in the first substrate 104.

This separation interface 202 forms a region of low resistance that will make it possible to separate the two portions of the first substrate 104 that are located on either side of the interface 202.

Figure 2B:
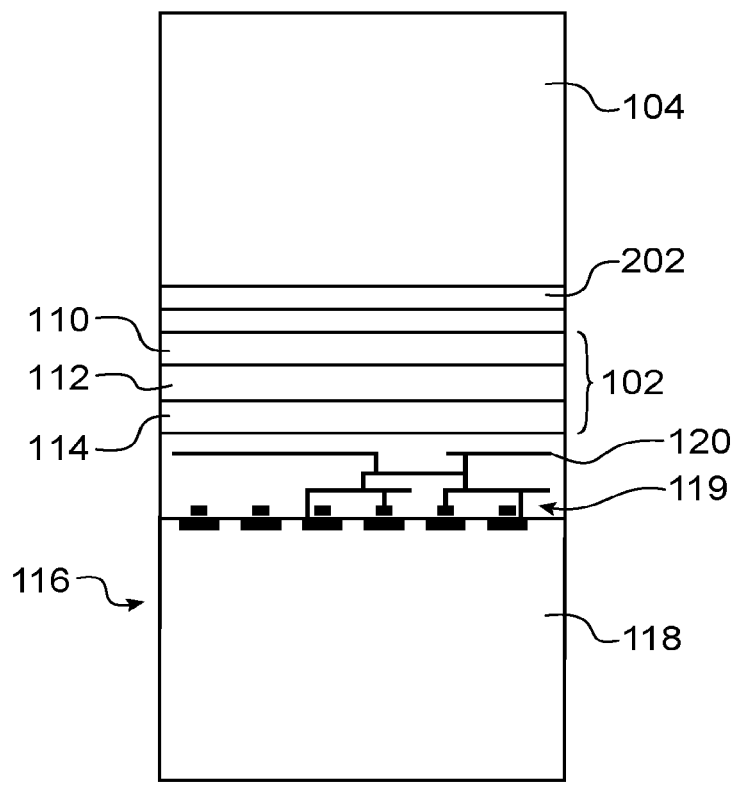

As in the first embodiment, the stack 102 is subsequently secured against a second substrate 116 such that the stack 102 is disposed between the first substrate 104 and the second substrate 116 (FIG. 2B). The securing between the second substrate 116 and the stack 102 includes for example the implementation of a direct bonding, as in the first embodiment.

Figure 2C:
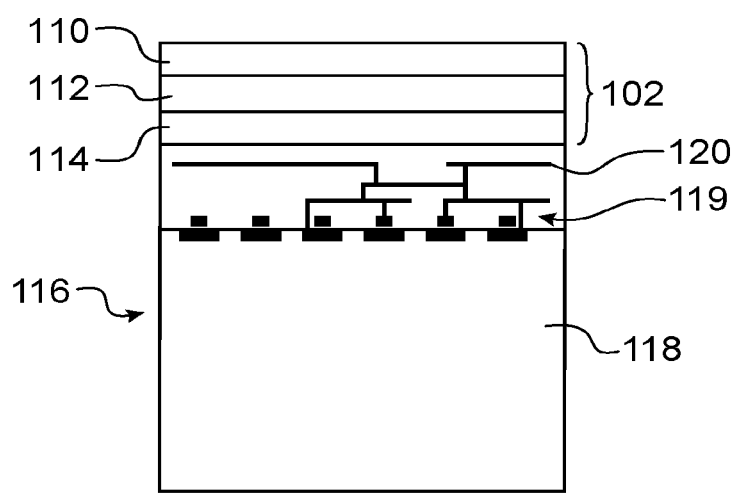
Figure 2D:
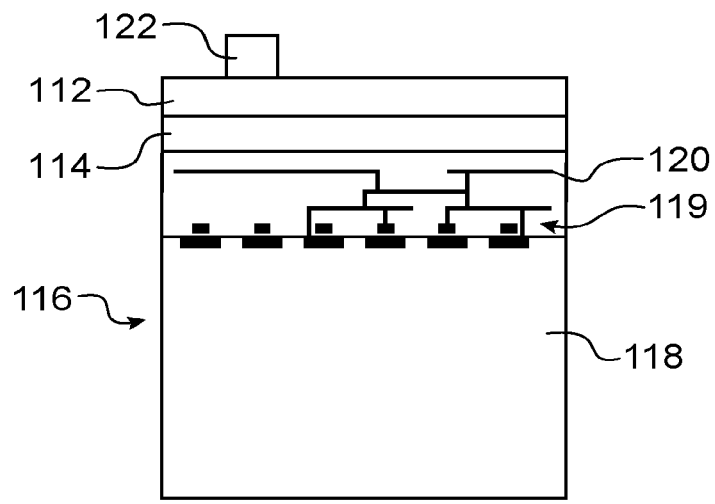
Figure 2E:
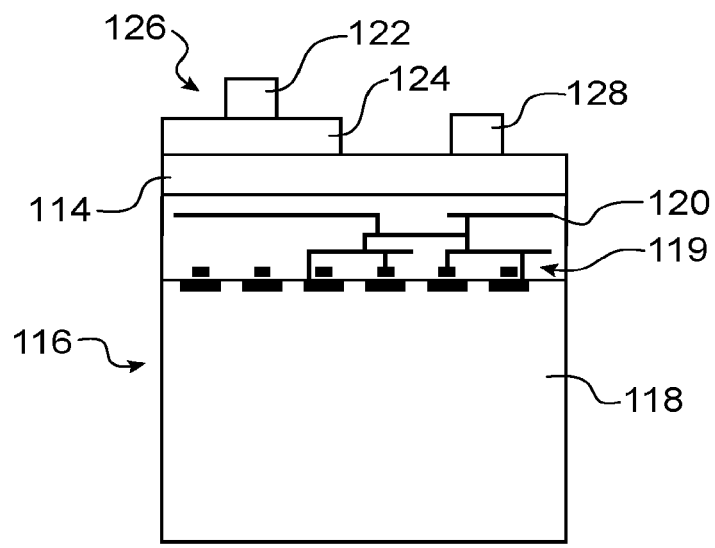
Figure 2F:
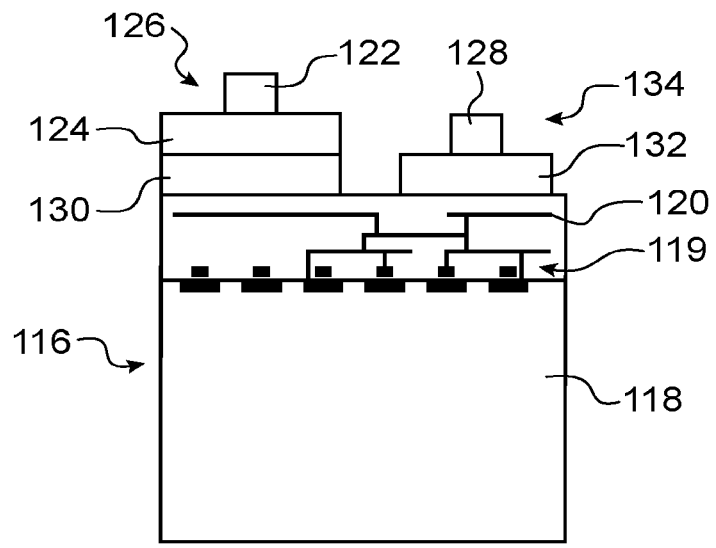
Figure 2G:
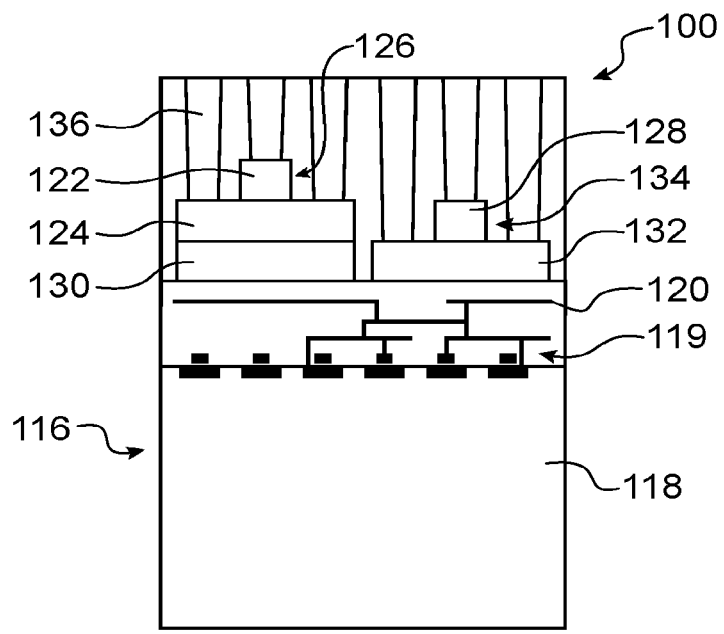

The first substrate 104 is subsequently removed (FIG. 2C). In this second embodiment, the first substrate 104 is removed at the separation interface 202 by coalescence of hydrogen bubbles obtained when exposed to a thermal annealing implemented at a temperature lower than 450° C. After said separation, the remaining material of the first substrate 104 present on the stack 102 is removed, for example by chemical attack, by using for example TMAH.

The steps subsequently implemented and shown in FIGS. 2D to 2G are identical to same previously described in relation to FIGS. 1D to 1G.

In the first and second embodiments described above, the first and third layers 110, 114 include SiGe and the second layer 112 includes silicon. Alternatively, it is possible that the first and third layers 110, 114 include silicon and that the second layer 112 includes SiGe. Said variant has the advantage of being able to implement selective etchings in order to etch the first and second semiconductor layers 110, 112.

According to another variant, it is possible that the first, second and third layers 110, 112, 114 all include silicon, or that same all include SiGe.

According to another variant, semiconductors other than silicon and SiGe may be used to form the layers 110, 112 and 114.

In addition, in the first and second embodiments described above, the first and third layers 110, 114 include P-doped semiconductor and the second layer 112 includes N-doped semiconductor. Alternatively, it is possible that the first and third layers 110, 114 include N-doped semiconductor and that the second layer 112 includes P-doped semiconductor.

Generally, the first layer 110 includes a first semiconductor doped according to a first conductivity type, the second layer 112 includes a second semiconductor (of identical nature or not to the first semiconductor) doped according to a second conductivity type opposite to the first conductivity type, and the third layer includes a third semiconductor (of identical nature or not to the first and second semiconductors) doped according to the first conductivity type.

In the first and second embodiments previously described, the second substrate 116 includes a layer 118 including electronic components 119, on which are located electrical interconnections layers 120 and forming a lower level of electronic components 119. Alternatively, the second substrate 116 may include a plurality of superimposed levels of electronic components that may be mutually electrically connected.

Alternatively, it is also possible that the integrated circuit 100 is not completed after the implementation of the steps previously described, but that said steps are repeated one or more times in order to form above the transistors 126, 134 one or more other additional levels of JFET transistors. In this case, during the implementation of said steps, the second substrate 116 on which the stack 102 is secured corresponds to the structure shown in one of FIG. 1G or 2G, the stack 102 being disposed above the transistors 126, 134 already produced. Said steps may be repeated a plurality of times in order to form a plurality of superimposed levels of JFET transistors.

In the embodiments and variants previously described, the second substrate 116 on which the JFET transistors 126, 134 are produced includes electronic components 119 and electrical interconnection levels 120 that must not be exposed to high thermal budgets. Alternatively, it is possible that the second substrate 116 corresponds to one or more layers of materials that degrade when same are exposed to too high temperatures (for example higher than 100° C.), such as for example polymer materials such as polyimide and/or polyethylene (PE) and/or polypropylene (PP) and/or polyethylene terephthalate (PET) and/or polyvinyl chloride (PVC).

In the embodiments and variants previously described, the stack 102 includes the three doped semiconductor layers 110, 112, 114 in order to produce, from this stack, N-type (N-channel) JFET transistors and P-type (P-channel) JFET transistors. Alternatively, the method previously described may be applied for the production of a single type of JFET transistor, N or P. Such a variant is described below in relation to FIGS. 3A to 3F.

Figure 3A:
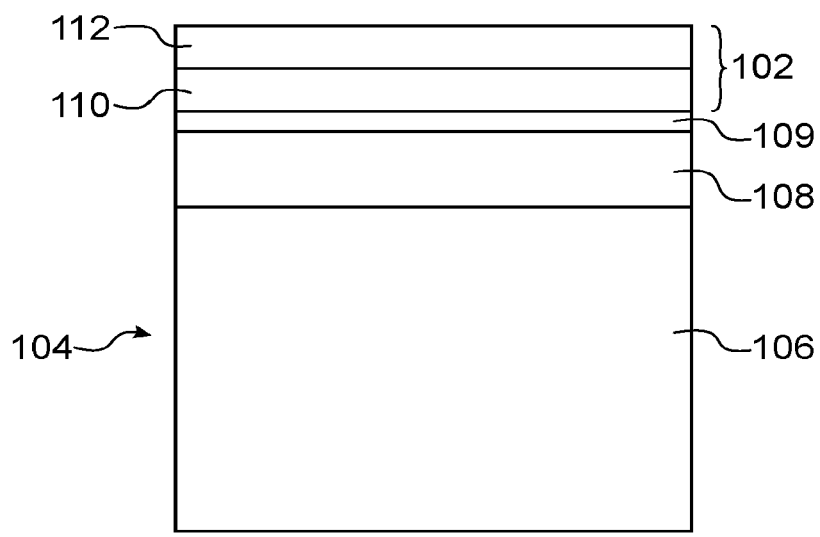
FIGS. 3A-3F show the steps of a method for producing JFET transistors according to a variant of the first embodiment.

The stack 102 of doped semiconductor layers is produced on the first substrate 104 that is for example identical to same previously described in relation to the first embodiment (FIG. 3A). Alternatively, it is possible that the first substrate 104 is identical to same previously described in relation to the second embodiment.

The stack 102 includes the first layer 110 that comprises P-doped semiconductor, for example SiGe, and the second layer 112 that comprises N-doped semiconductor, for example silicon. The materials, dopings and dimensions are for example identical to same previously described in relation to the first and second embodiments as well as the variants thereof.

Figure 3B:
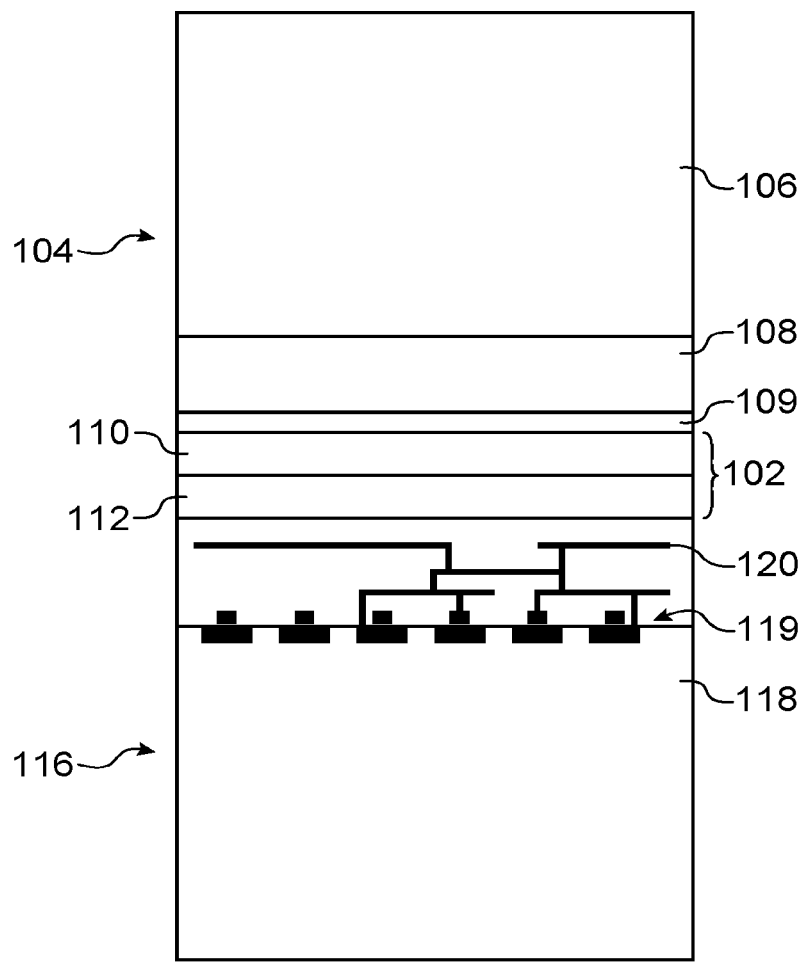

As in the first and second embodiments, the stack 102 is subsequently turned over then secured against the second substrate 116 (FIG. 3B).

Figure 3C:
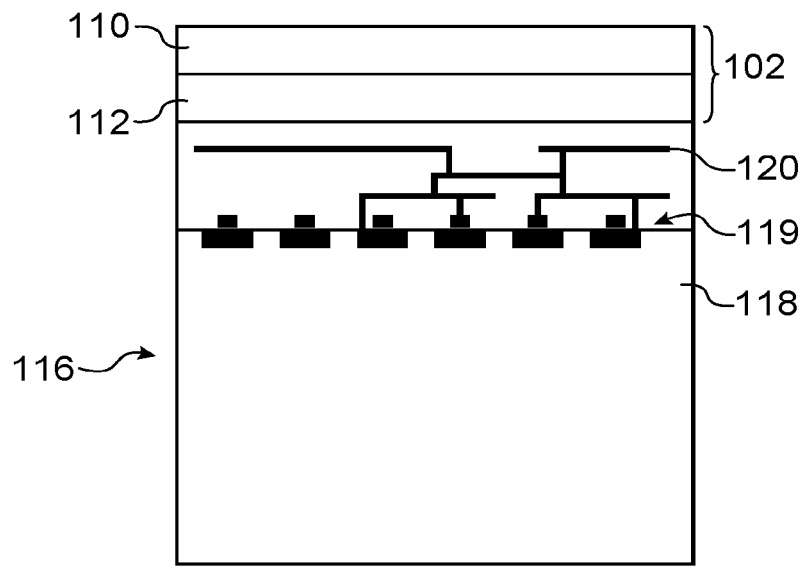

The first substrate 104 is subsequently removed (FIG. 3C).

Figure 3D:
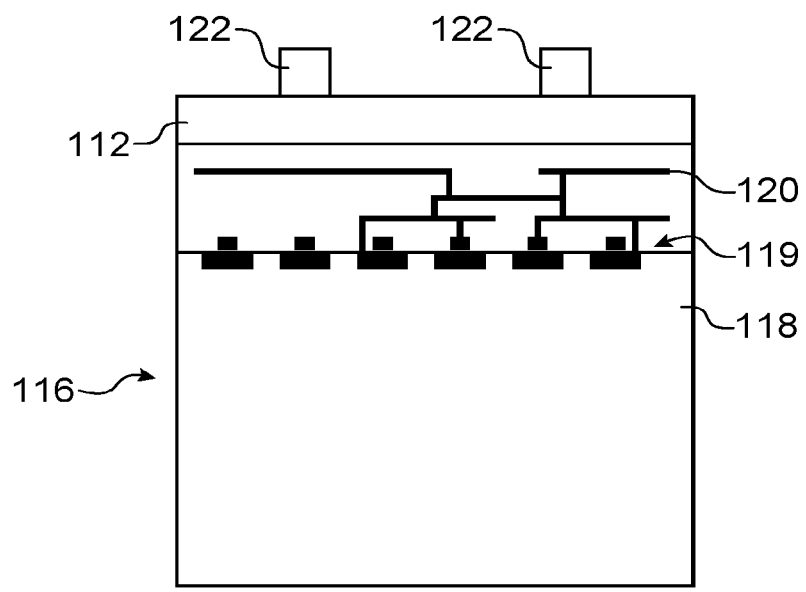

The first layer 110 is subsequently etched such that one or more remaining portions of the first layer 110 form the front gates 122 of the JFET transistors 126 (FIG. 3D).

Figure 3E:
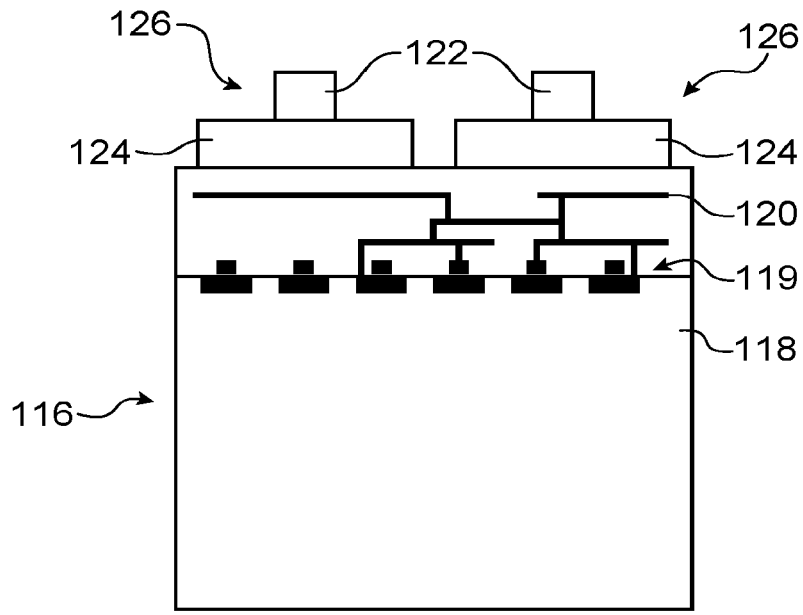

The second layer 112 is subsequently etched such that one or more remaining portions 124 of the second layer 112 are disposed below the front gates 122 of the JFET transistors 126 and form the channels, the sources and the drains of said JFET transistors 126 (FIG. 3E).

Figure 3F:
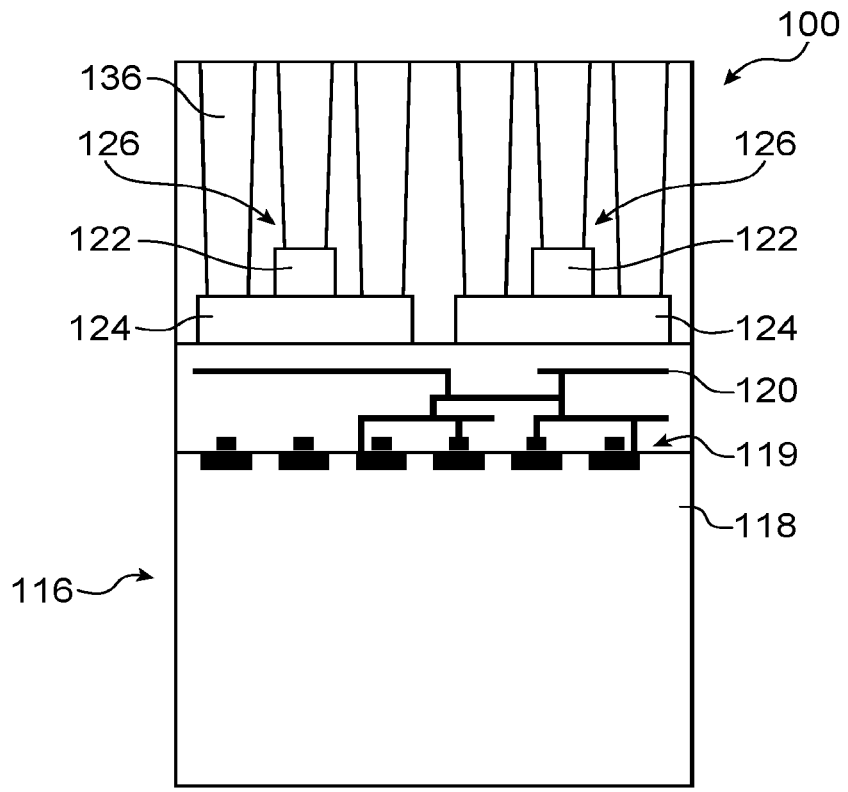

The method is completed by producing on the JFET transistors 126 electrical interconnections 136 connected to the gates, to the sources and to the drains of said JFET transistors 126 (FIG. 3F). Said electrical interconnections 136 form the Back End Of Line (BEOL) of the circuit 100 produced.

In the variant described above in relation to FIGS. 3A to 3F, the doping of the semiconductors of the layers 110 and 112 differs depending on whether the JFET transistors 126 produced are of P or N type. In order to produce P-type JFET transistors 126, the first layer 110 includes a N-type semiconductor and the second layer 112 includes a P-type semiconductor. In order to produce N-type JFET transistors 126, the first layer 110 includes a P-type semiconductor and the second layer 112 includes a N-type semiconductor.

According to another variant, it is also possible that the stack 102 includes more than three superimposed doped semiconductor layers. Such a variant is described below in relation to FIGS. 4A to 4F, according to one specific embodiment wherein the stack 102 includes four superimposed doped semiconductor layers. However, said variant may be applied with a stack 102 including more than four superimposed doped semiconductor layers.

Figure 4A:
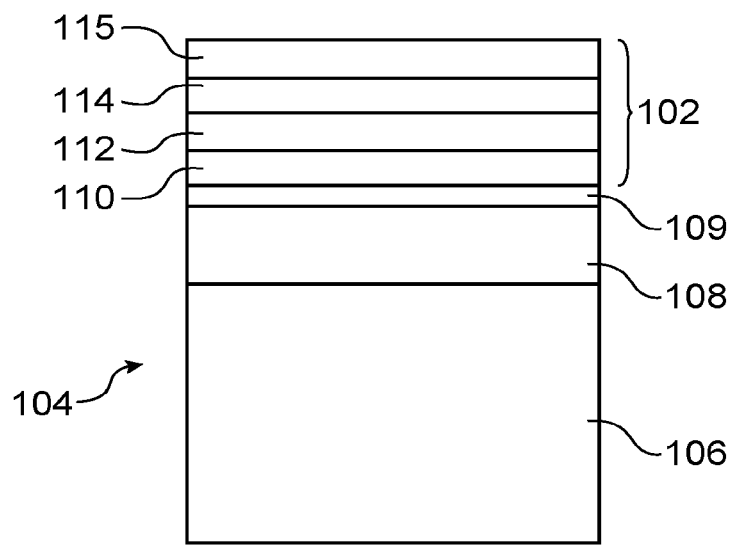
FIGS. 4A-4G show the steps of a method for producing JFET transistors according to another variant of the first embodiment.

The stack 102 of doped semiconductor layers is produced on the first substrate 104 that is for example identical to same previously described in relation to the first embodiment (FIG. 4A). Alternatively, it is possible that the first substrate 104 is identical to same previously described in relation to the second embodiment.

The stack 102 includes the first layer 110 that comprises N-doped semiconductor, for example silicon, the second layer 112 that comprises P-doped semiconductor, for example SiGe, the third layer 114 that comprises N-doped semiconductor, for example similar to same of the first layer 110, and a fourth layer 115 that comprises P-doped semiconductor, for example similar to same of the second layer 112. The materials, dopings and dimensions are for example identical to same previously described in relation to the first and second embodiments as well as the variants thereof. The thickness of the fourth layer 115 is for example similar to same of the other layers 110, 112, 114 of the stack 102.

Figure 4B:
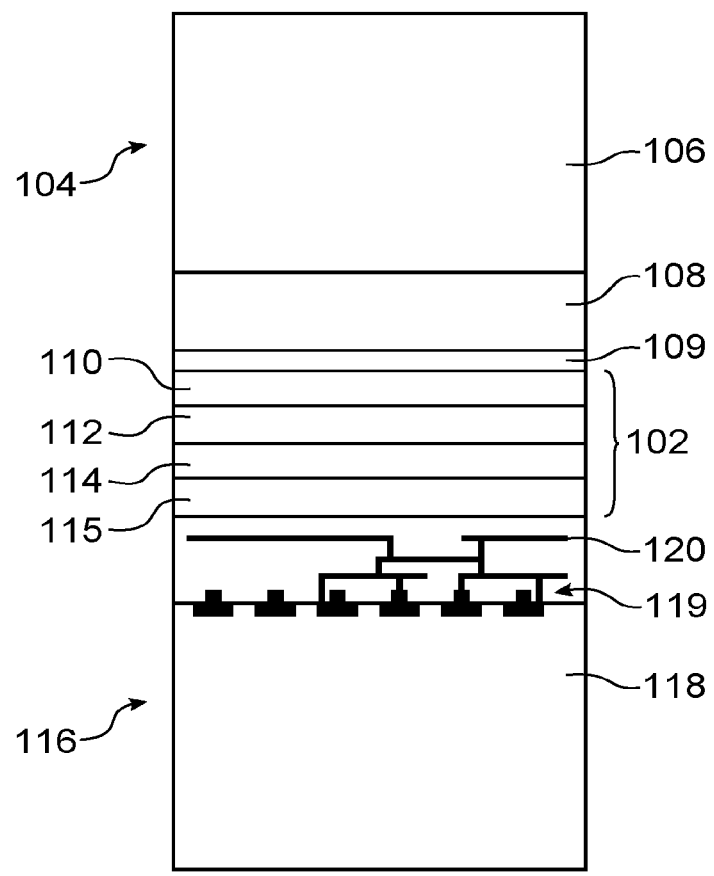

As in the first and second embodiments, the stack 102 is subsequently turned over then secured against the second substrate 116 (FIG. 4B).

Figure 4C:
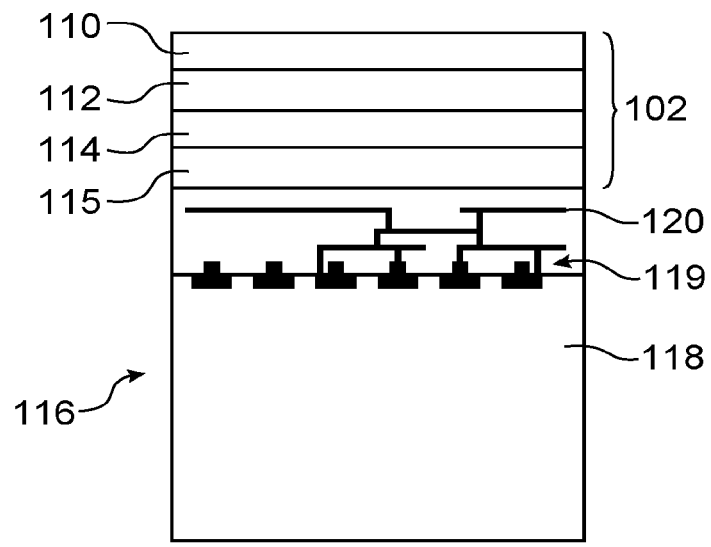

The first substrate 104 is subsequently removed (FIG. 4C).

Figure 4D:
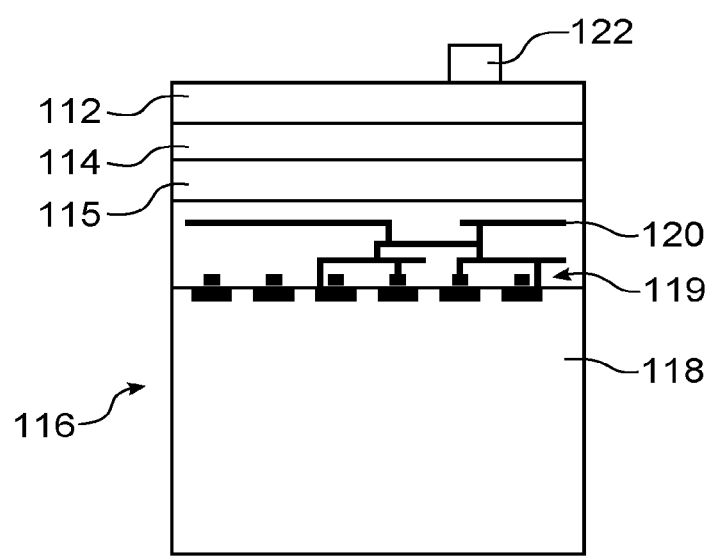

The first layer 110 is subsequently etched such that one or more remaining portions of the first layer 110 form the front gates 122 of the JFET transistors 126 (FIG. 4D).

Figure 4E:
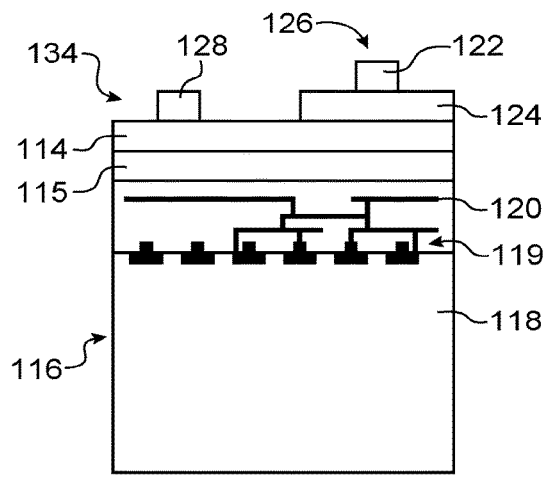

The second layer 112 is subsequently etched such that one or more remaining portions 124 of the second layer 112 are disposed below the front gates 122 of the JFET transistors 126 and form the channels, the sources and the drains of said JFET transistors 126, and such that one or more remaining portions of the second layer 112 form the front gates 128 of the second JFET transistors 134 (FIG. 4E).

The third layer 114 is subsequently etched such that at least one first remaining portion 130 of the third layer 114 is disposed below the channel, the source and the drain of the first JFET transistor 126 and that at least one second remaining portion 132 of the third layer 114 is disposed below the front gate 128 of the second JFET transistor 134 and forms the channel, the source and the drain of the second JFET transistor 134.

Figure 4F:
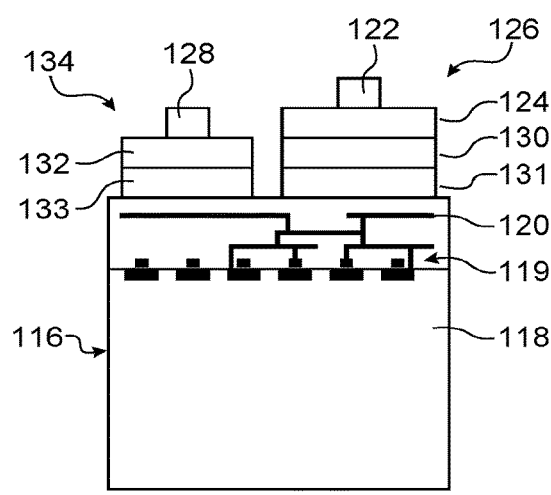

The fourth layer 115 is subsequently etched such that at least one first remaining portion 131 of the fourth layer 115 is disposed below the remaining portion 130 of the third layer 114, and that at least one second remaining portion 133 of the fourth layer 115 is disposed below the channel, the source and the drain of the second JFET transistor 134 (FIG. 4F).

The presence of the portion 130 below the first JFET transistor 126 and of the portion 133 below the second JFET transistor 134 makes it possible to increase the depletion in the channels of the first and second JFET transistors 126, 134.

Figure 4G:
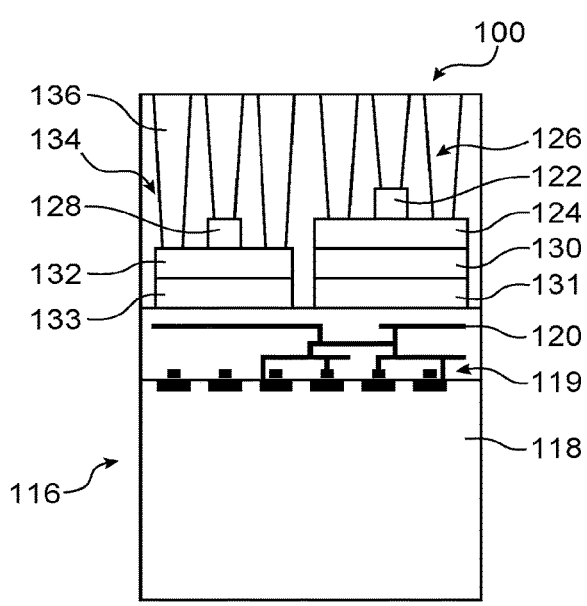

The method is completed by producing on the JFET transistors 126, 134 electrical interconnections 136 connected to the gates, to the sources and to the drains of said JFET transistors 126, 134 (FIG. 4G). Said electrical interconnections 136 form the Back End Of Line (BEOL) of the integrated circuit 100 produced.

The variant described above in relation to FIGS. 4A-4G may be applied to the first and second embodiments previously described, and may be combined with the other variants previously described.

Figure 5:
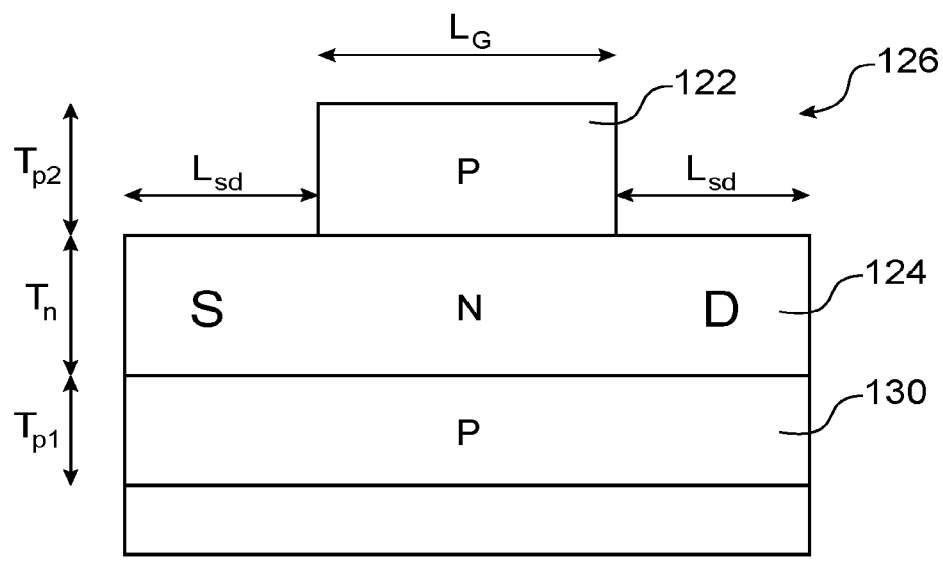
FIG. 5 schematically shows a JFET transistor obtained by the implementation of the method according to an embodiment of the invention.

FIG. 5 schematically shows a N-type JFET transistor 126 obtained by the implementation of the method according to one of the first and second embodiments. In said figure, the various dimensions of the elements of the JFET transistor 126 are shown by arrows and are named.

Figure 6:
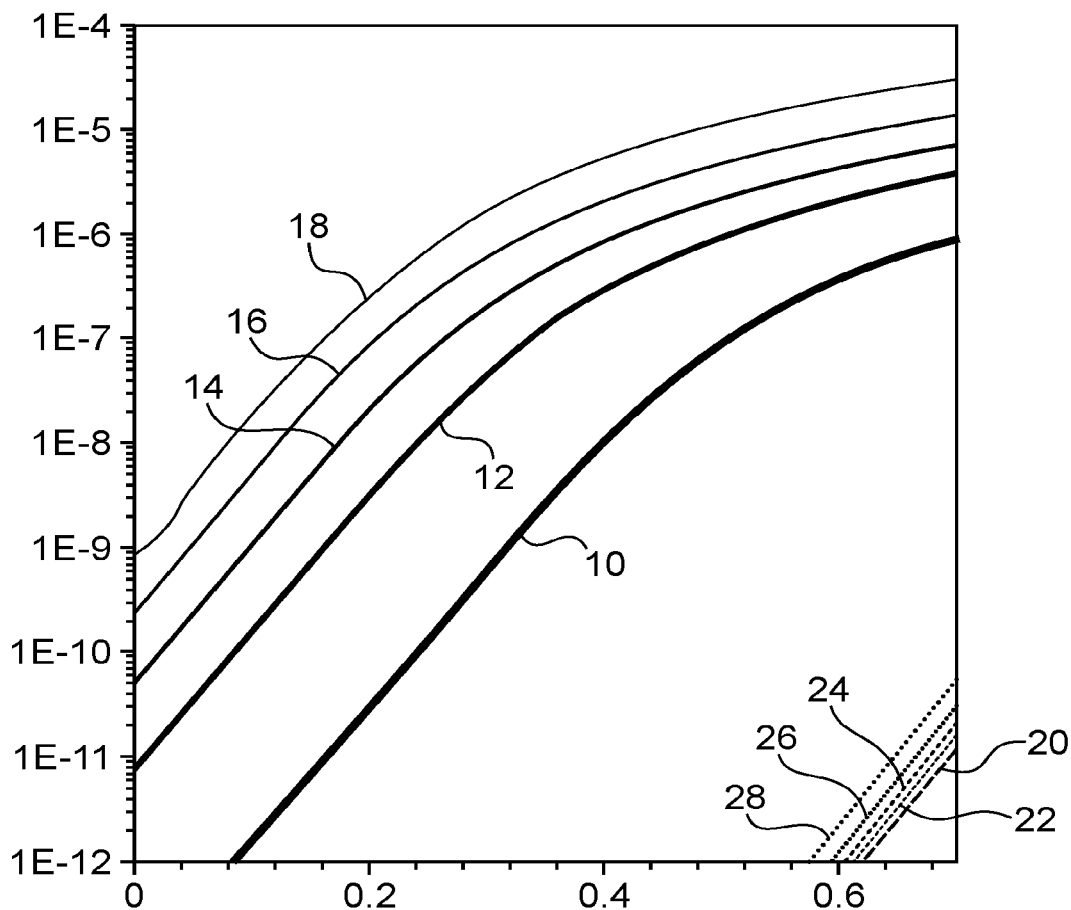
FIG. 6 shows the drain and gate currents in a JFET transistor obtained by the implementation of the method according to an embodiment of the invention.

The curves visible in FIG. 6 show the drain current and the gate current obtained in such a JFET transistor 126 depending on the gate voltage applied, and for various values of the channel width W (not visible in FIG. 5, and that corresponds to the dimension of the channel along the axis perpendicular to the plane wherein the transistor 126 of FIG. 5 is drawn).

Said curves are obtained for a JFET transistor 126 comprising:
a front gate 122 formed by a portion of P-doped SiGe with a concentration of dopants equal to $5.10^{19}$ at/cm$^3$,
a channel, a source and a drain formed by a portion 124 of N-doped silicon with a concentration of dopants equal to $1.10^{19}$ at/cm$^3$ and disposed on a portion 130 of P-doped SiGe with a concentration of dopants equal to $2.10^{19}$ at/cm$^3$,
a gate length $L_G$ equal to 30 nm,
a thickness $T_{P1}$ of the portion 130 equal to 10 nm,
a thickness $T_N$ of the portion 124 equal to 10 nm,
a thickness $T_{P2}$ of the front gate 122 equal to 12 nm,
a source and drain length $L_{SD}$ equal to 30 nm,
an electric potential applied on the source equal to 0 V and an electric potential applied on the drain equal to 0.7 V.

The curves 10, 12, 14, 16 and 18 show the drain current obtained for a channel width W respectively equal to 10 nm, 20 nm, 30 nm, 50 nm, 100 nm.

The curves 20, 22, 24, 26 and 28 show the gate current obtained for a channel width W respectively equal to 10 nm, 20 nm, 30 nm, 50 nm, 100 nm.

Said curves show the correct operation of the JFET transistors obtained by the implementation of the method described here. The horizontal axis shows the voltage applied to the gate 122 and the vertical axis shows the drain and gate currents. By taking for example the case of a width of the JFET equal to 20 nm (curves 12 and 22), it can be seen that the drain current of the JFET in the "ON" state for a gate voltage of 0.7 V is approximately 500,000 higher than the current of the JFET in the "OFF" state for a gate voltage of 0 V. It will also be noted that the gate current 22 is negligible compared to the drain current 12.

The invention claimed is:

1. A method for producing at least one first JFET transistor, comprising at least the steps of:
a) producing, on a first substrate, a stack comprising at least one first layer comprising a first semiconductor doped according to a first conductivity type and a second layer comprising a second semiconductor doped according to a second conductivity type opposite to the first conductivity type, then
b) securing the stack against a second substrate such that the stack is disposed between the first substrate and the second substrate; said at least one first layer being disposed between the first substrate and a second substrate, then
c) removing the first substrate, then
d) etching said at least one first layer such that at least one remaining portion of said at least one first layer forms a front gate of said at least one first JFET transistor, then
e) etching the second layer such that at least one first remaining portion of the second layer is disposed below the front gate of said at least one first JFET transistor and forms the channel, the source and the drain of said at least one first JFET transistor.

2. The method according to claim 1, wherein the second substrate includes CMOS-type electronic components.

3. The method according to claim 1, wherein the second substrate includes at least one material whose electrical properties change when it is exposed at a temperature higher than 100° C.

4. The method according to claim 1, wherein the first semiconductor is silicon or SiGe, and wherein the second semiconductor is silicon or SiGe.

5. The method according to claim 1, wherein the stack includes a third layer comprising a third semiconductor doped according to the first conductivity type and such that the second layer is disposed between said at least one first layer and the third layer.

6. The method according to claim 5, wherein step e) is implemented such that at least one second remaining portion of the second layer forms a front gate of a second JFET transistor.

7. The method according to claim 6, further includes, after step e), step 0 of etching the third layer such that at least one first remaining portion of the third layer is disposed below the channel, the source and the drain of said at least one first JFET transistor and that at least one second remaining portion of the third layer is disposed below the front gate of the second JFET transistor and forms the channel, the source and the drain of the second JFET transistor.

8. The method according to claim 5, wherein the first and third semiconductors are identical.

9. The method according to claim 8, wherein:
the first and third semiconductors are silicon and the second semiconductor is SiGe, or
the first and third semiconductors are SiGe and the second semiconductor is silicon.

10. The method according to claim 7, wherein the stack includes a fourth layer comprising a fourth semiconductor doped according to the second conductivity type and such that the third layer is disposed between the second layer and the fourth layer, and further including, after step f), step g) of etching the fourth layer such that at least one first remaining portion of the fourth layer is disposed below said at least one first remaining portion of the third layer and that at least one second remaining portion of the fourth layer is disposed below the channel, the source and the drain of the second JFET transistor.

11. The method according to claim 1, wherein the securing of the stack against the second substrate includes a direct bonding between a first oxide layer produced on the stack and a second oxide layer produced on the second substrate.

12. The method according to claim 1, wherein step c) includes an elimination of the first substrate by abrasion and by chemical attack.

13. The method according to claim 1, wherein the first substrate is of SOI type.

14. The method according to claim 1, further including, before step b), a step of producing a separation interface in the first substrate, and wherein step c) includes a separation of the first substrate at the separation interface.

15. The method according to claim 14, wherein the production of the separation interface in the first substrate includes at least one implantation of ions in the first substrate.

16. The method according to claim 1, further including, after step e), the production of electrical interconnections electrically connected at least to the front gate, the source and to the drain of the first JFET transistor.

17. The method according to claim 1, wherein steps a) to e) are repeated one or more times by using, as second substrate, the structure obtained during the previous implementation of steps a) to e).

18. The method according to claim 1, further including, between steps a) and b), a step of turning over the assembly comprising the first substrate and the stack such that the stack is disposed opposite the second substrate.

19. The method according to claim 1, wherein said at least one first layer and the second layer are produced by epitaxy.

* * * * *